（12） United States Patent
Kitsunezuka et al.

(10) Patent No.: US 12,400,888 B2
(45) Date of Patent: Aug. 26, 2025

(54) DATA FUSION OF MULTIPLE SENSORS

(71) Applicant: Tokyo Electron Limited, Tokyo (JP)

(72) Inventors: Masaki Kitsunezuka, Sapporo (JP); Chungjong Lee, Tokyo (JP); Jun Shinagawa, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 496 days.

(21) Appl. No.: 17/710,085

(22) Filed: Mar. 31, 2022

(65) Prior Publication Data

US 2023/0317483 A1 Oct. 5, 2023

(51) Int. Cl.
*H01L 21/67* (2006.01)
*G01R 31/28* (2006.01)
*G05B 19/418* (2006.01)
*H01J 37/32* (2006.01)

(52) U.S. Cl.
CPC .... *H01L 21/67276* (2013.01); *G01R 31/2831* (2013.01); *G05B 19/41865* (2013.01); *G05B 19/41875* (2013.01); *H01J 37/32963* (2013.01); *H01J 37/32972* (2013.01); *G05B 2219/32368* (2013.01); *G05B 2219/45031* (2013.01)

(58) Field of Classification Search
CPC .......... H01L 21/67276; G01R 31/2831; G05B 19/41865; G05B 19/41875; G05B 2219/32368; G05B 2219/45031; G05B 2219/32187; H01J 37/32963; H01J 37/32972
See application file for complete search history.

(56) References Cited

U.S. PATENT DOCUMENTS

| | | | |
|---|---|---|---|
| 6,896,763 B2 | 5/2005 | Balasubramhanya et al. | |
| 8,193,007 B1 * | 6/2012 | Madriaga | H01L 21/67069 |
| | | | 257/E21.528 |
| 8,362,949 B2 | 1/2013 | Yang et al. | |
| 8,368,741 B2 | 2/2013 | Jelley et al. | |

(Continued)

FOREIGN PATENT DOCUMENTS

JP 5980828 B2 * 8/2016 ........... G01N 21/211

OTHER PUBLICATIONS

Federico Castanedo, "A Review of Data Fusion Techniques", Hindawi Publishing Corporation, the Scientific World Journal, Article ID: 704504, 2013, 20 pages.

*Primary Examiner* — Eyob Hagos
(74) *Attorney, Agent, or Firm* — Oblon, McClelland, Maier & Neustadt, L.L.P.

(57) ABSTRACT

Provided is a method for monitoring a plasma-related process in a plasma tool. The method includes measuring data associated with the plasma-related process using a plurality of sensors while executing the plasma-related process on a wafer. Respective data measured by each sensor of the plurality of sensors are input into a respective individual estimation method to output a respective individual wafer state of the wafer, which results in a plurality of individual wafer states. The respective individual estimation method is configured to estimate the respective individual wafer state using at least the respective data. The plurality of individual wafer states is input into an integrated estimation method to output an integrated wafer state of the wafer. The integrated estimation method is configured to estimate the integrated wafer state using at least the plurality of individual wafer states.

21 Claims, 13 Drawing Sheets

(56) References Cited

U.S. PATENT DOCUMENTS

| | | |
|---|---|---|
| 8,928,587 B1 | 1/2015 | Smus |
| 8,979,271 B2 | 3/2015 | Pletcher et al. |
| 9,097,800 B1 | 8/2015 | Zhu |
| 9,140,555 B1 | 9/2015 | Andersson et al. |
| 9,344,639 B2 | 5/2016 | Musatenko et al. |
| 9,386,230 B1 | 7/2016 | Duran et al. |
| 9,404,756 B2 | 8/2016 | Fong et al. |
| 9,462,423 B1 | 10/2016 | Rivlin et al. |
| 9,549,124 B2 | 1/2017 | Duran et al. |
| 9,607,226 B2 | 3/2017 | Zhu et al. |
| 9,613,423 B2 | 4/2017 | Dixon et al. |
| 9,654,700 B2 | 5/2017 | Kovtun et al. |
| 9,661,466 B1 | 5/2017 | Andersson et al. |
| 9,678,102 B2 | 6/2017 | Ho et al. |
| 9,746,852 B1 | 8/2017 | Watts et al. |
| 9,821,463 B2 | 11/2017 | Kuffner, Jr. et al. |
| 9,838,602 B2 | 12/2017 | Duran et al. |
| 9,852,156 B2 | 12/2017 | Petrou et al. |
| 10,008,003 B2 | 6/2018 | Kirmani et al. |
| 10,120,057 B1 | 11/2018 | Byrne et al. |
| 10,209,062 B1 | 2/2019 | Le Grand |
| 10,249,047 B2 | 4/2019 | Jia et al. |
| 10,268,321 B2 | 4/2019 | Poupyrev |
| 10,330,489 B1 | 6/2019 | Andersson et al. |
| 10,346,463 B2 | 7/2019 | Petrou et al. |
| 10,401,490 B2 | 9/2019 | Gillian et al. |
| 10,459,080 B1 | 10/2019 | Schwesig et al. |
| 10,482,379 B2 | 11/2019 | Holt et al. |
| 10,488,523 B2 | 11/2019 | Watts et al. |
| 10,496,182 B2 | 12/2019 | Lien et al. |
| 10,565,732 B2 | 2/2020 | Zhao et al. |
| 10,641,613 B1 | 5/2020 | Andersson et al. |
| 10,664,061 B2 | 5/2020 | Poupyrev |
| 10,754,419 B2 | 8/2020 | Chung et al. |
| 10,802,147 B2 | 10/2020 | Nerurkar et al. |
| 10,818,105 B1 | 10/2020 | Konrardy et al. |
| 11,137,350 B2 * | 10/2021 | Wang ................ G01B 11/0633 |
| 2004/0106284 A1 * | 6/2004 | Grasshoff ......... H01J 37/32963 |
| | | 257/E21.252 |
| 2018/0051984 A1 * | 2/2018 | Shchegrov .............. H01L 22/12 |
| 2018/0061691 A1 * | 3/2018 | Jain ........................ H01L 22/12 |
| 2018/0323151 A1 * | 11/2018 | Briggs ............. H01L 21/76865 |
| 2019/0321719 A1 | 10/2019 | Gillian et al. |
| 2021/0027117 A1 | 1/2021 | McGavran et al. |
| 2021/0116896 A1 | 4/2021 | Arabshahi et al. |
| 2022/0216038 A1 * | 7/2022 | Wu ................... H01J 37/32174 |
| 2023/0135167 A1 * | 5/2023 | Lapidot .............. H01L 21/6719 |
| | | 438/5 |
| 2023/0238266 A1 * | 7/2023 | Schulze ............. H01L 21/6831 |
| | | 356/601 |

\* cited by examiner

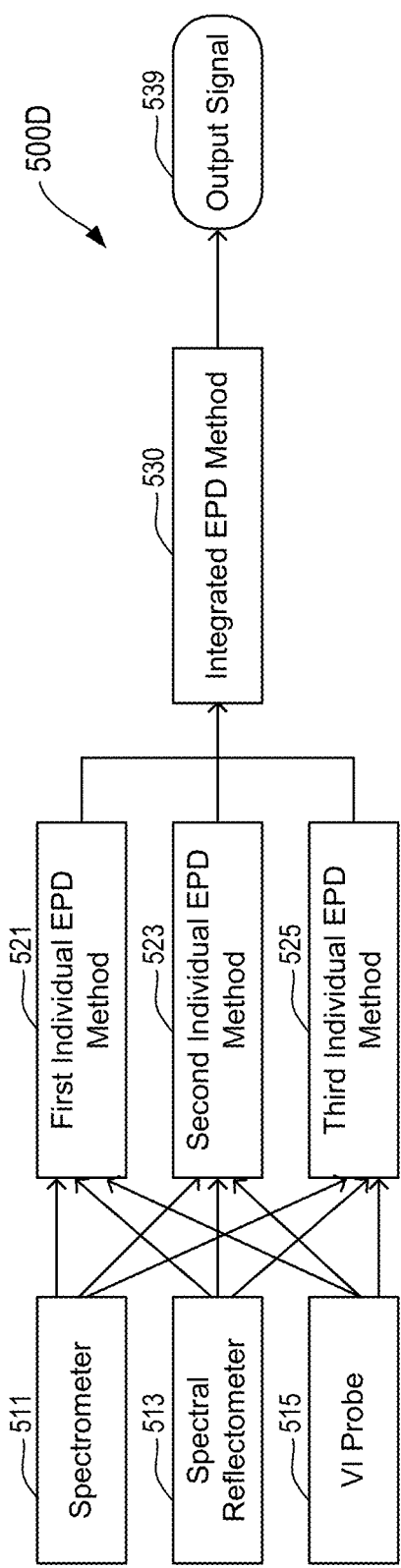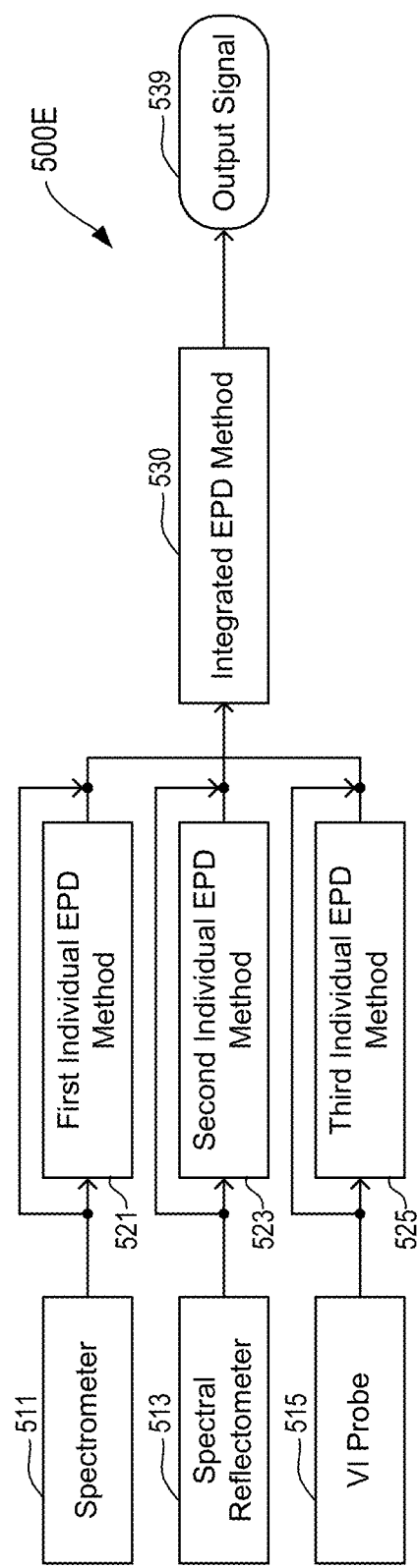

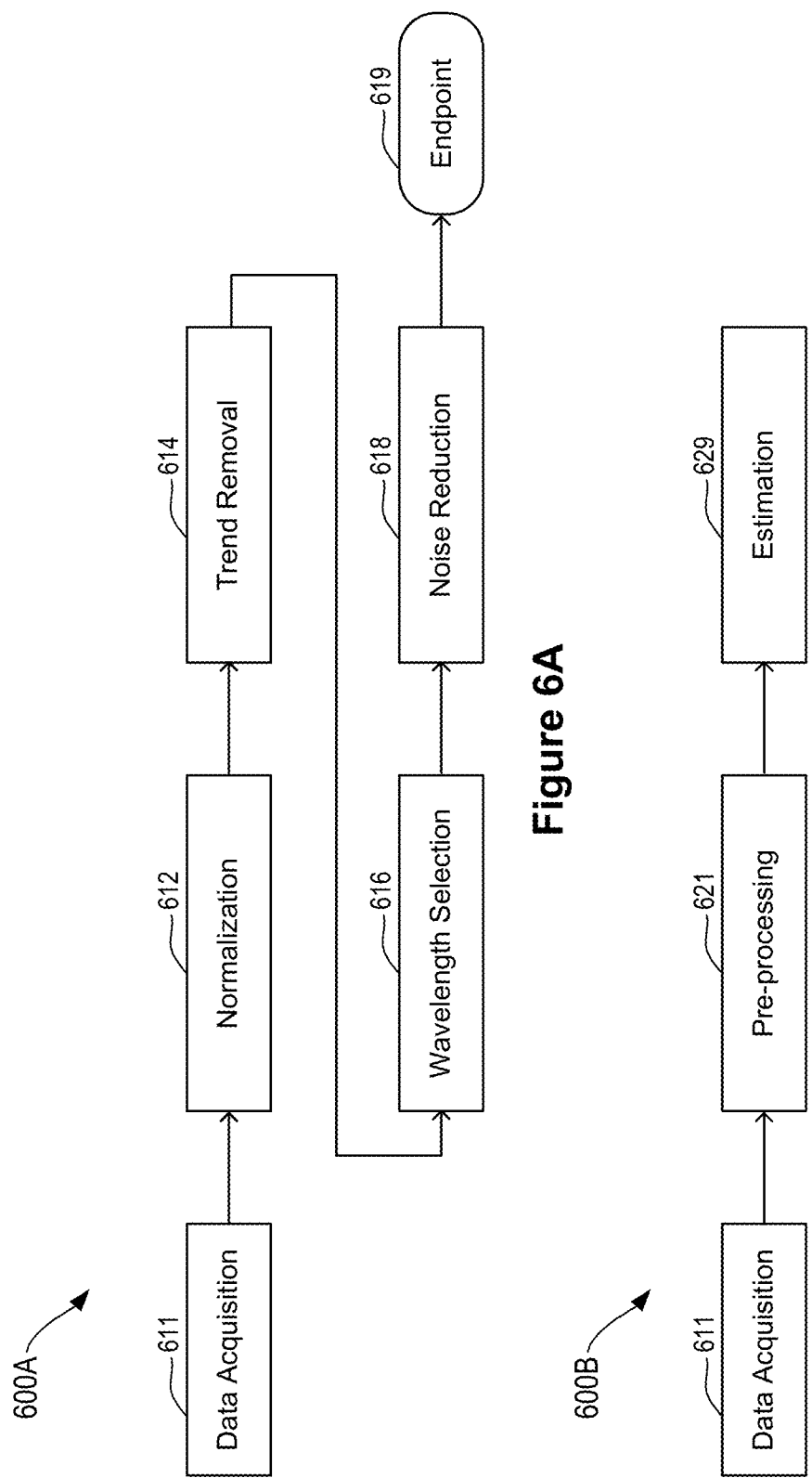

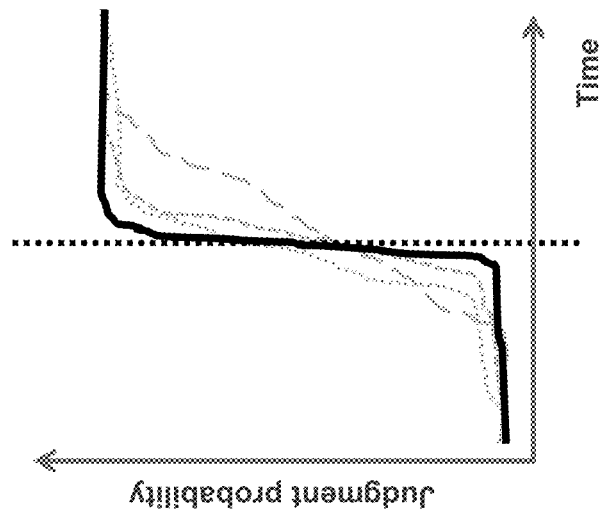
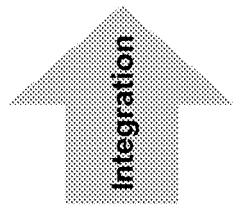
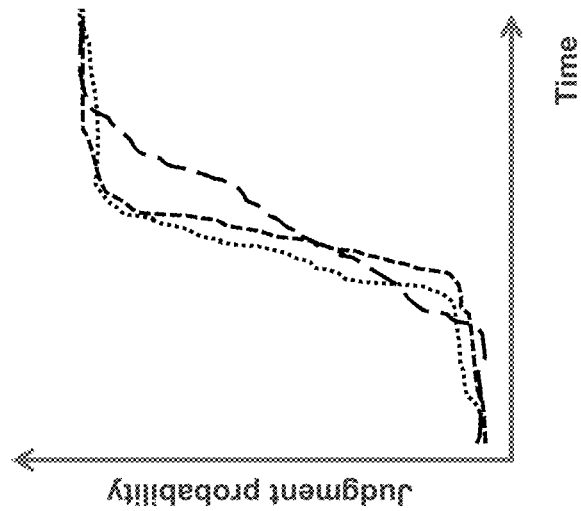
Figure 8A
Figure 8B

DATA FUSION OF MULTIPLE SENSORS

FIELD OF THE INVENTION

This disclosure relates generally to semiconductor fabrication and, more particularly, to data fusion.

BACKGROUND

Device formation within microelectronic workpieces typically involves a series of manufacturing techniques related to the formation, patterning and removal of a number of layers of materials on a substrate. To meet the physical and electrical specifications of current and next generation semiconductor devices, process flows are being developed to reduce feature size while maintaining structure integrity for various patterning processes. Particularly, plasma processing plays a vital role in the deposition and removal of materials in the production of semiconductor devices. Typical examples include plasma-assisted chemical vapor deposition, plasma-assisted physical vapor deposition, plasma etch, plasma cleaning, etc.

SUMMARY

The present disclosure relates to a method for data fusion of multiple sensors.

Aspect (1) includes a method for monitoring a plasma-related process in a plasma tool. The method includes measuring data associated with the plasma-related process using a plurality of sensors while executing the plasma-related process on a wafer. Respective data measured by each sensor of the plurality of sensors are input into a respective individual estimation method to output a respective individual wafer state of the wafer, which results in a plurality of individual wafer states. The respective individual estimation method is configured to estimate the respective individual wafer state using at least the respective data. The plurality of individual wafer states is input into an integrated estimation method to output an integrated wafer state of the wafer. The integrated estimation method is configured to estimate the integrated wafer state using at least the plurality of individual wafer states.

Aspect (2) includes the method of Aspect (1), further including inputting the plurality of individual wafer states into an anomaly detection method that is configured to detect an anomaly using at least the plurality of individual wafer states.

Aspect (3) includes the method of Aspect (2), further including inputting respective time-series data measured by at least two sensors of the plurality of sensors into at least two respective individual estimation methods to output at least two time series of individual wafer states. The at least two time series of individual wafer states are input into the anomaly detection method.

Aspect (4) includes the method of Aspect (3), further including comparing respective transition slopes and respective transition timings of the at least two time series of individual wafer states.

Aspect (5) includes the method of Aspect (4), wherein an anomaly of sensor sensitivity is detected when a first difference between the respective transition slopes exceeds a first threshold. An anomaly of process uniformity is detected when a second difference between the respective transition timings exceeds a second threshold. At least one anomaly of a sensor, a respective individual estimation method or the plasma-related process is detected when the first difference exceeds the first threshold and the second difference exceeds the second threshold. No anomaly is detected when the first difference is within the first threshold and the second difference is within the second threshold.

Aspect (6) includes the method of Aspect (3), further including plotting one of the at least two time series versus another one of the at least two time series.

Aspect (7) includes the method of Aspect (2), further including, when an anomaly is detected for one or more sensors of the plurality of sensors, removing one or more respective individual wafer states from the plurality of individual wafer states before inputting the plurality of individual wafer states into the integrated estimation method.

Aspect (8) includes the method of Aspect (1), further including inputting, in addition to the plurality of individual wafer states, respective data measured by at least one sensor of the plurality of sensors into the integrated estimation method to output the integrated wafer state.

Aspect (9) includes the method of Aspect (1), further including inputting, in addition to first data measured by a first sensor of the plurality of sensors, respective data measured by one or more other sensors of the plurality of sensors into a first individual estimation method to output a first individual wafer state.

Aspect (10) includes the method of Aspect (1), wherein first data measured by a first sensor of the plurality of sensors are input into a first individual estimation method to output a first individual wafer state. The first data are input into at least another first individual estimation method to output at least another first individual wafer state.

Aspect (11) includes the method of Aspect (1), wherein the integrated estimation method is configured to estimate the integrated wafer state by averaging the plurality of individual wafer states, when the plurality of individual wafer states each is continuous.

Aspect (12) includes the method of Aspect (1), wherein the integrated estimation method is configured to estimate the integrated wafer state by outputting a representative individual wafer state that is identical to at least half of the plurality of individual wafer states, when the plurality of individual wafer states each is discrete or categorical.

Aspect (13) includes the method of Aspect (1), wherein at least one individual estimation method includes a regression model that is configured to estimate and output a respective individual wafer state that is continuous.

Aspect (14) includes the method of Aspect (1), wherein at least one individual estimation method includes a classification model that is configured to output a probability that the respective individual wafer state is in a specified class.

Aspect (15) includes the method of Aspect (1), wherein the integrated wafer state includes at least one of a critical dimension (CD), an etch rate, etch selectivity, an amount of remaining mask material, a deposition rate, a film thickness, a film chemical composition, a film reflectivity, film absorbance, film resistivity or film conductivity.

Aspect (16) includes the method of Aspect (1), wherein at least one individual estimation method is configured to output an endpoint time, output a probability that the plasma-related process has reached an endpoint or output whether or not the plasma-related process has reached an endpoint.

Aspect (17) includes the method of Aspect (1), wherein the plurality of sensors includes at least two of a spectrometer, an ellipsometer, a scatterometer, a reflectometer, a voltage and current (VI) probe, an optical emission spectrometry (OES) sensor, a plasma sensor, a mass spectrometer or a radio frequency (RF) sensor.

Aspect (18) includes the method of Aspect (17), wherein the plurality of sensors includes a spectrometer, a spectral reflectometer and a VI probe.

Aspect (19) includes a method for monitoring a plasma-related process in a plasma tool. The method includes measuring data associated with the plasma-related process using a plurality of sensors while executing the plasma-related process on a wafer. The data are input into an integrated estimation method to output an integrated wafer state of the wafer. The integrated estimation method is configured to estimate the integrated wafer state using the data.

Aspect (20) includes an apparatus. The apparatus includes a controller including a processor that is programmed to measure data associated with a plasma-related process using a plurality of sensors while executing the plasma-related process on a wafer. The processor is programmed to input respective data measured by each sensor of the plurality of sensors into a respective individual estimation method to output a respective individual wafer state of the wafer, which results in a plurality of individual wafer states. The respective individual estimation method is configured to estimate the respective individual wafer state using at least the respective data. The processor is programmed to input the plurality of individual wafer states into an integrated estimation method to output an integrated wafer state of the wafer. The integrated estimation method is configured to estimate the integrated wafer state using at least the plurality of individual wafer states.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 5D shows yet another diagram of yet another EPD process, in accordance with yet another embodiment of the present disclosure.

FIG. 5E shows yet another diagram of yet another EPD process, in accordance with yet another embodiment of the present disclosure.

FIG. 6A shows a diagram of an individual EPD method, in accordance with one embodiment of the present disclosure.

FIG. 6B shows another diagram of another individual EPD method, in accordance with another embodiment of the present disclosure.

FIGS. 8A and 8B respectively show data processing before and after data fusion, in accordance with some example embodiments of the present disclosure.

DETAILED DESCRIPTION

Figure 1:
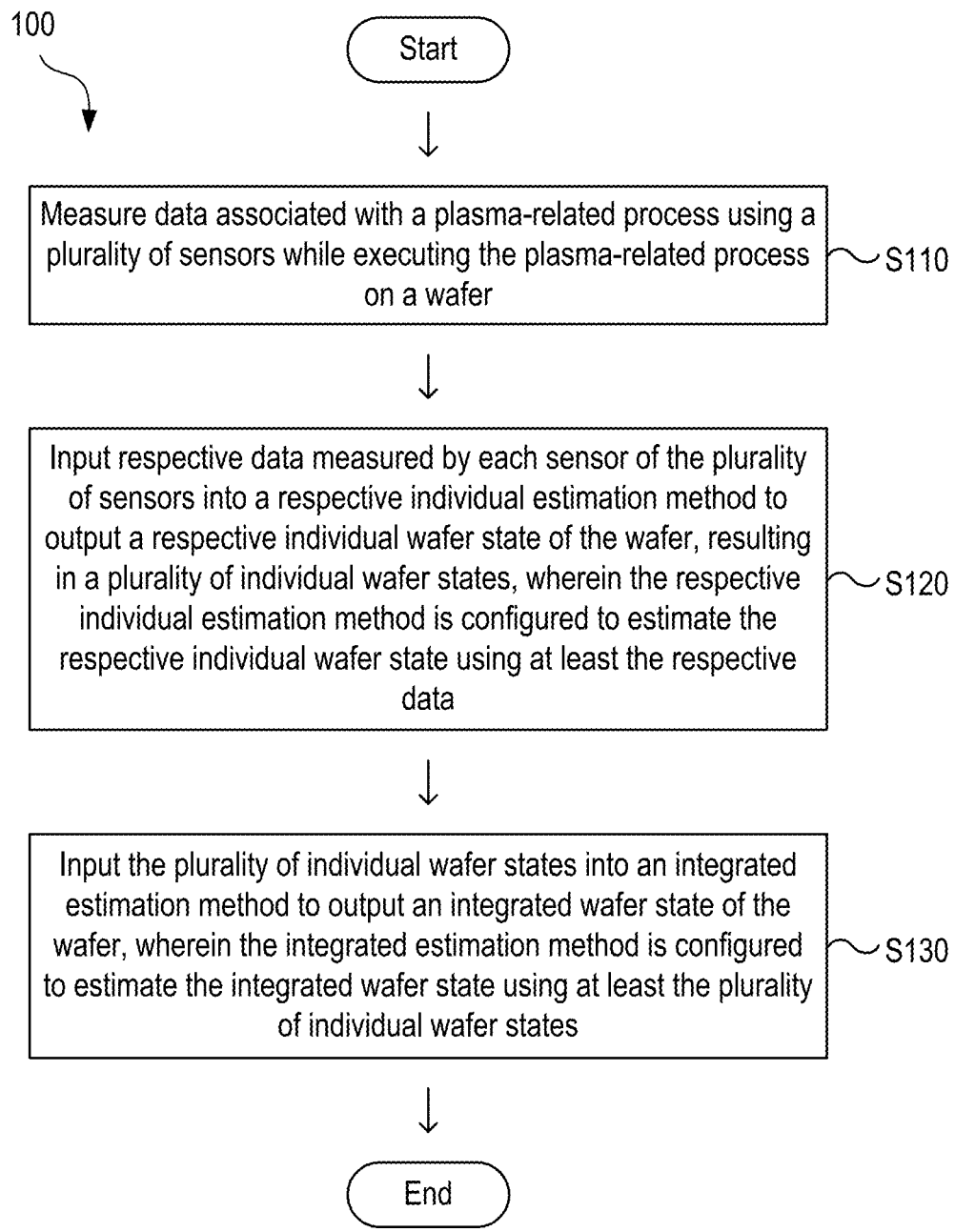
FIG. 1 shows a flow chart of a process for data fusion of multiple sensors in a plasma tool, in accordance with some example embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, plasma processing tools or plasma tools are widely used in the manufacture of microelectronic devices. Typically, a plasma-related process is executed on a wafer in a processing chamber of the plasma tool. The plasma-related process can include, but is not limited to, film deposition, etching and/or cleaning. During the plasma-related process, tool conditions often change or drift over time, and even the slightest change in a critical parameter can sometimes lead to highly undesirable economic results. Meanwhile, small changes can easily occur in many aspects of a plasma tool, such as wafer chuck temperature, plasma gas pressure, etch gas composition, chamber wall stickiness and the like. Therefore, it is important to monitor the plasma-related process and the wafer for a variety of purposes, including fault detection, endpoint detection, etc. Faults can include any events that would induce a process to go out of control limits.

Conventional monitoring for the purposes of fault detection, endpoint detection, etc. is usually accomplished by using a sensor installed in the plasma tool. The sensor can, for example, measure a plasma parameter (such as a plasma species concentration) or a wafer characteristic (such as a film reflectivity). The parameter measured by the sensor is thus used to monitor the process and/or the wafer. Depending on a single sensor, such monitoring can be inaccurate and unreliable, especially when a fault or failure occurs with this single sensor.

Figure 2A:
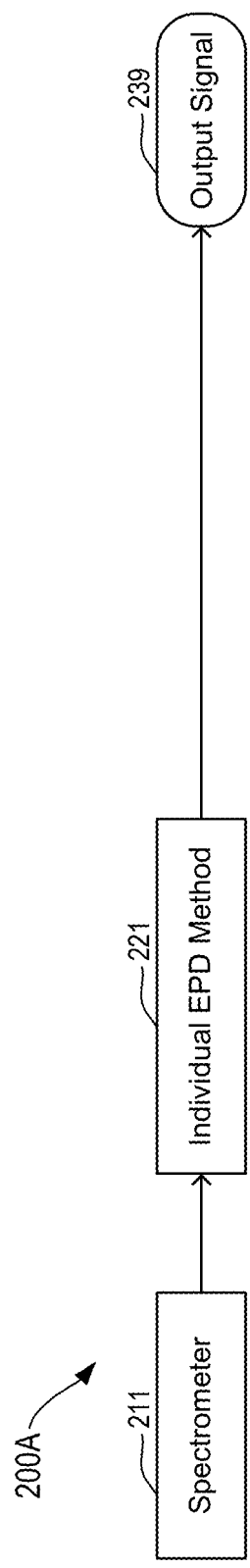
FIG. 2A (background art) shows a diagram of an endpoint detection (EPD) process, in related examples.

FIG. 2A (background art) shows a diagram of an endpoint detection (EPD) process 200A in related examples. A single sensor, such as a spectrometer 211, is used for EPD. Data collected by the spectrometer 211 are used as an input for an individual EPD method 221 which is configured to estimate and output an output signal 239, such as a probability of reaching an endpoint, or whether or not the endpoint has been reached. When the spectrometer 211 malfunctions, the endpoint cannot be accurately determined. More importantly, such a malfunction may not be detected until after having caused substantial economic loss.

Figure 2B:
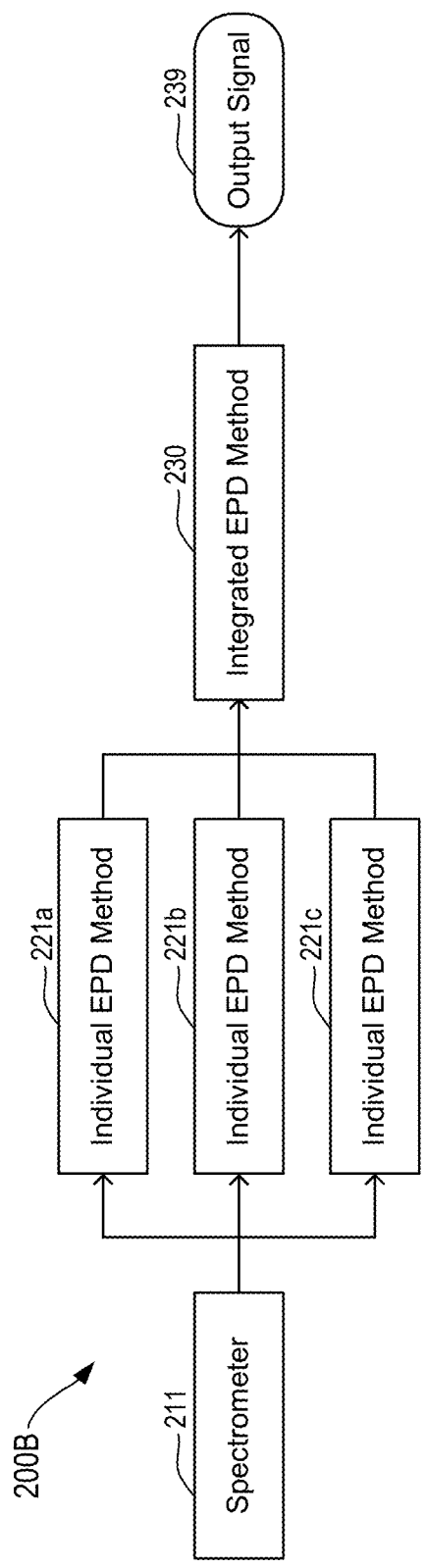
FIG. 2B (background art) shows another diagram of another EPD process, in related examples.

FIG. 2B (background art) shows a diagram of an EPD process 200B in related examples. The EPD process 200B is similar to the EPD process 200A. Nevertheless, a plurality of individual EPD methods (e.g. 221a, 221b and 221c) is used, and an integrated EPD method 230 is configured to estimate and output the output signal 239. By providing multiple individual EPD methods (or algorithms), robust EPD is rendered possible with more than one algorithm. However, the EPD process 200B will also fail if the sensor malfunctions.

Alternatively, multiple sensors can also be used in conventional monitoring, but the multiple sensors are usually used individually for specific application needs. For example, in a plasma etch system, an endpoint can be detected both using optical emission spectroscopy (OES) signals for applications where an etching process continues down to a stop layer and using a spectroscopic reflectometer for applications where an etching process ends at the middle of an etching layer. In addition, endpoint signals can be detected with voltage (V), current (I) or phase of VI using a VI probe, or impedance measured by RF match box as disclosed in U.S. Pat. No. 6,599,759. Nevertheless, such systems often fail to detect sensor faults, and wafers are scrapped when a failure in the wafer state detection system (e.g. an endpoint detection system) is undetected during the process.

In autonomous operation, fault detection and classifications (FDC) as well as advanced process control (APC) systems can be used to detect and address faults. Specifically, FDC can be used to detect and classify faults and determine the best course of action for correcting the faults, including utilizing APC. APC can be used to tune control knobs to keep operation within the control limits. Autonomous operation often requires sensor data of high reliability and accuracy, which can improve reliability and accuracy of FDC and APC systems. Moreover, high-quality sensor data can enable FDC without necessitating high-volume data, advanced algorithms or accuracy improvement in virtual metrology (VM) models, by which fault detection is often implemented.

According to aspects of the disclosure, quality of sensor data can be improved by selecting a set of plasma diagnostic sensors that measure electrical and/or chemical characteristics of plasma as well as sensors that can measure wafer properties. Reliability can be improved by minimizing or eliminating measurement errors in the selected sensors.

Techniques herein enable data fusion of multiple sensors, such as a plurality of in-situ sensors. Various data can be measured or collected by the multiple sensors while a process is executed on a wafer in the plasma tool. Instead of utilizing and processing the various data individually to monitor the process and/or the wafer, techniques herein leverage an integrated estimation method that can be configured to estimate and output an integrated wafer state using at least the various data. By integrating the various data measured by the multiple sensors, the wafer state can be robustly monitored even when one or more sensors fail. Techniques herein can also enable detection of wafer condition defects (e.g. deterioration of etch rate, process non-uniformity, etc.), which could not be detected by a single sensor or by multiple sensors whose data are individually utilized. Moreover, techniques herein allow for detection of sensor malfunctions or faults, which is often elusive in related technology and yet highly important for wafer monitoring.

FIG. 1 shows a flow chart of a process 100 for data fusion of multiple sensors for monitoring a plasma-related process in a plasma tool, in accordance with some example embodiments of the present disclosure. The process 100 begins with Step S110 where data associated with the plasma-related process are measured using a plurality of sensors while the plasma-related process is executed on a wafer. In a non-limiting example (e.g. FIG. 4), the plurality of in-situ sensors includes a spectrometer, a spectral reflectometer and a VI probe.

A "sensor" used herein generally refers to any device, machine, module or subsystem that detects or measures a physical, electrical or chemical property in an environment and provides a representation of the physical, electrical or chemical property. For instance, the sensor can produce an output signal which contains information pertaining to the physical, electrical or chemical property of a plasma in a plasmas tool. The sensor can be an in-situ sensor which is exposed to a processing environment associated with a plasma process. For example, the in-situ sensor can be exposed to the plasma through an optical lens for an optical emission spectrometry (OES) sensor or exposed through an RF feed rod for a voltage and current (VI) sensor/probe. The in-situ sensor can be located inside (e.g. mounted onto) the chamber or located outside the chamber. The in-situ sensor can be configured to sense a process inside the chamber, e.g. a spectrometer such as an OES sensor. The in-situ sensor can also be configured to sense a system attached to the chamber. For example, a VI probe measures voltage and current on an RF feed line to a plasma chamber. The sensor can include, but is not limited to, a spectrometer, an ellipsometer, a scatterometer, a reflectometer, a VI probe, an OES sensor, a plasma sensor, a mass spectrometer or a radio frequency (RF) sensor.

The process 100 then proceeds to Step S120 by inputting respective data measured by each sensor of the plurality of sensors into a respective individual estimation method to output a respective individual wafer state of the wafer, which results in a plurality of individual wafer states. The respective individual estimation method is configured to estimate the respective individual wafer state using at least the respective data.

In some embodiments (e.g. FIG. 5D), not only first data measured by a first sensor of the plurality of sensors, but also respective data measured by one or more other sensors of the plurality of sensors, are input into a first individual estimation method to output a first individual wafer state. For example, first data measured by the spectrometer, second data measured by the spectral reflectometer and third data measured by the VI probe can be input into a first individual estimation method to output a first individual wafer state. Similarly, the second data and the third data may be input into a second individual estimation method to output a second individual wafer state.

In some embodiments (e.g. FIG. 5C), respective data measured by a given sensor of the plurality of sensors can be put into more than one respective individual estimation method to output more than one respective individual wafer state. For instance, the first data may be input into two first individual estimation methods to output two first individual wafer states.

At Step S130, the plurality of individual wafer states is input into an integrated estimation method to output an integrated wafer state of the wafer. The integrated estimation method is configured to estimate the integrated wafer state using at least the plurality of individual wafer states.

In some embodiments (e.g. FIG. 5E), not only the plurality of individual wafer states, but also respective data measured by at least one sensor of the plurality of sensors, are input into the integrated estimation method to output the integrated wafer state. For instance, the first data, the second data and/or the third data may be input into the integrated estimation method.

In some embodiments (e.g. FIG. 5F), an anomaly detection method can be utilized to detect an anomaly using at least the plurality of individual wafer states. For instance, respective time-series data measured by at least two sensors of the plurality of sensors can be input into at least two respective individual estimation methods to output at least two time series of individual wafer states. Then, the at least two time series of individual wafer states can be input into the anomaly detection method that is configured to detect an anomaly by comparing the at least two time series of individual wafer states.

Further, it should be understood that any combinations of the embodiments described herein and/or variations can also be implemented while still taking advantage of the techniques described herein. Techniques herein are applicable to a variety of processes in a plasma tool, including but not limited to endpoint detection of a plasma etch process, film thickness prediction in a film formation (or deposition) process and a resist coating process. In the following descriptions, the endpoint detection of a plasma etch process will be used as an example for illustrative purposes. Of course, other processes can also be implemented while still taking advantage of the techniques described herein.

Figure 3:
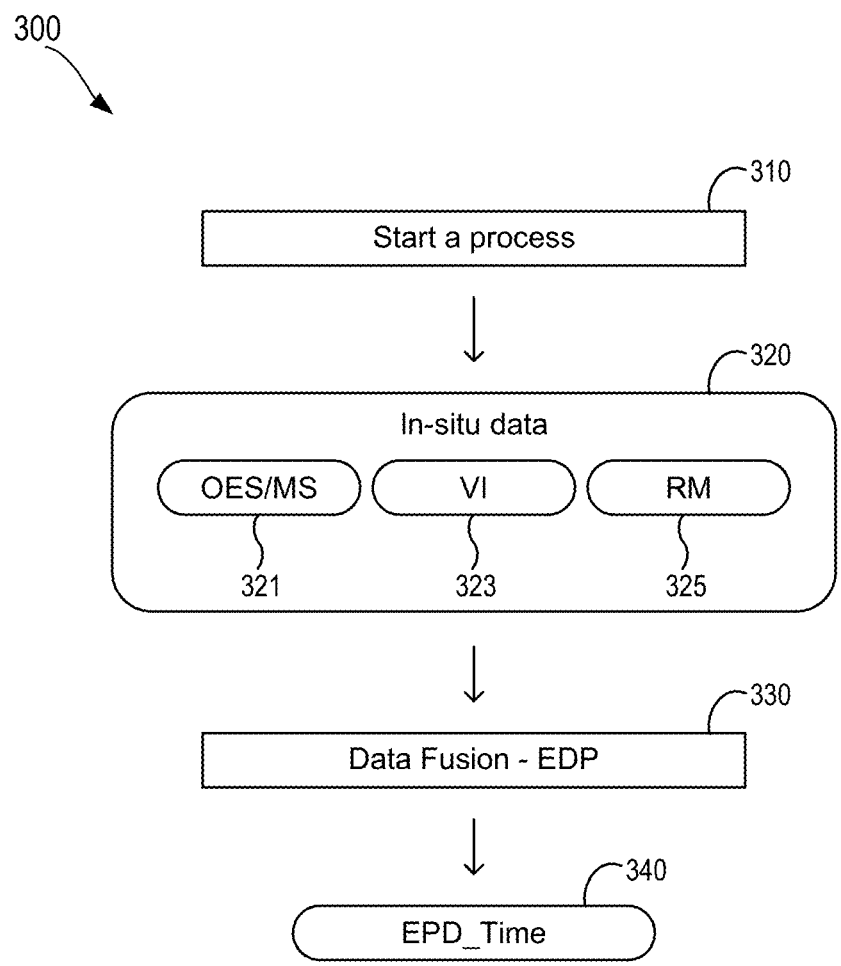
FIG. 3 shows a flow chart of an EPD process, in accordance with one embodiment of the present disclosure.

FIG. 3 shows a flow chart of an EPD process 300, in accordance with one example embodiment of the present disclosure. In Block 310A, a process, such as a plasma etch process, can be started and executed on a wafer. In-situ sensor data 320 are collected by a plurality of sensors during the process. The in-situ sensor data 320 can, for example, include optical emission spectrometry (OES) data and mass spectrometry (MS) data (denoted as OES/MS 321), voltage (V) and current (I) data (denoted as VI 323) and reflectometry (RM) data (denoted as RM 325). In Block 330, the in-situ sensor data 320 can go through a process of data fusion for endpoint detection (EPD), which will be explained later. As a result, EPD_time 340, i.e. an endpoint time, can be obtained.

Figure 4:
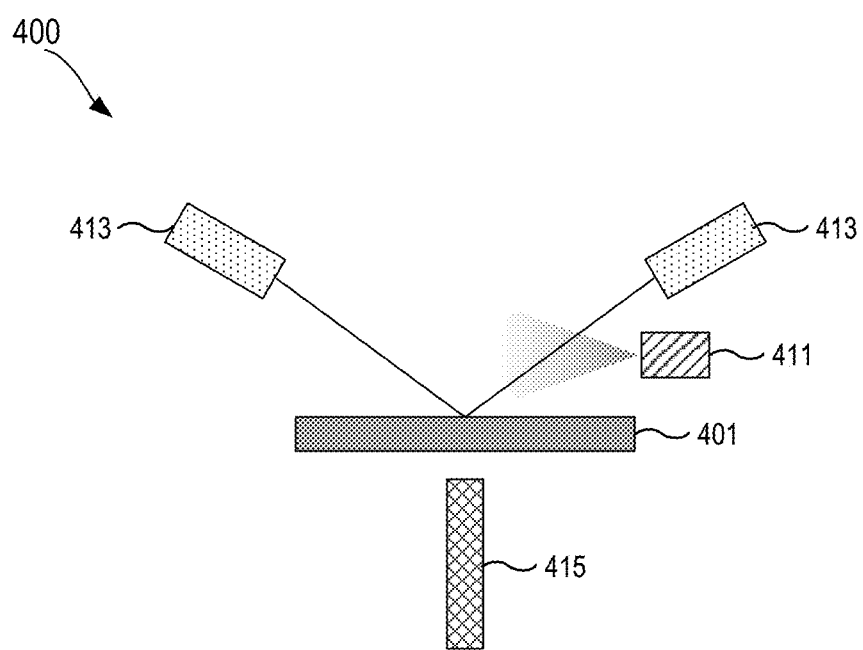
FIG. 4 shows a schematic of wafer monitoring using multiple sensors, in accordance with one embodiment of the present disclosure.

FIG. 4 shows a schematic 400 of wafer monitoring using multiple sensors, in accordance with one example embodiment of the present disclosure. In this example, a wafer 401 is monitored by three sensors, i.e. a spectrometer 411, a spectral reflectometer 413 and a VI probe 415. Specifically, the spectrometer 411 can be used for looking at the chemistry of the plasma in a plasma-related process. Since it is viewed from a side (or an edge of the wafer 401), the spatial distribution of sensor data tends to weigh more at the edge than a center of the wafer 401. That is, the spectrometer 411 is located away from the center of the wafer 401 and collects signals from the edge of the wafer 401. Therefore, first data measured by the spectrometer 411 may include more information about the edge of the wafer 401 than the center of the wafer 401.

The spectral reflectometer 413 can be used to study geometric and optical properties of a surface of the wafer 401. Since a laser of the spectral reflectometer 413 is applied to the center of the wafer 401, second data measured by the spectral reflectometer 413 may include relatively more information about the center of the wafer 401. The VI probe 415 can be used to study electrical properties of the plasma such as an overall density of the plasma. Third data measured by the VI probe 415 may reveal information about the (entire) wafer 401.

While not shown, a control unit or controller can be configured to receive data from sensors, for example receiving the first data from the spectrometer 411, the second data from the spectral reflectometer 413 and the third data from the VI probe 415. The control unit can be configured to adjust knobs and control settings for the sensors and/or other components of a corresponding plasma tool. It is also noted that the adjustments can be manually made as well. Other variations can also be implemented.

As can be appreciated, the first data measured by the spectrometer 411, the second data measured by the spectral reflectometer 413 and the third data measured by the VI probe 415 include different information which may be complimentary to each other. Rather than use the first data, the second data and the third data individually for EPD, an integrated estimation method can be expected to improve accuracy and reliability. In the following descriptions, FIGS. 5A-5F can show six embodiments of data fusion for integrating the first data, the second data and the third data for EPD. Note that similar or identical components are labeled with similar or identical numerals throughout FIGS. 5A-5F unless specified otherwise.

Figure 5A:
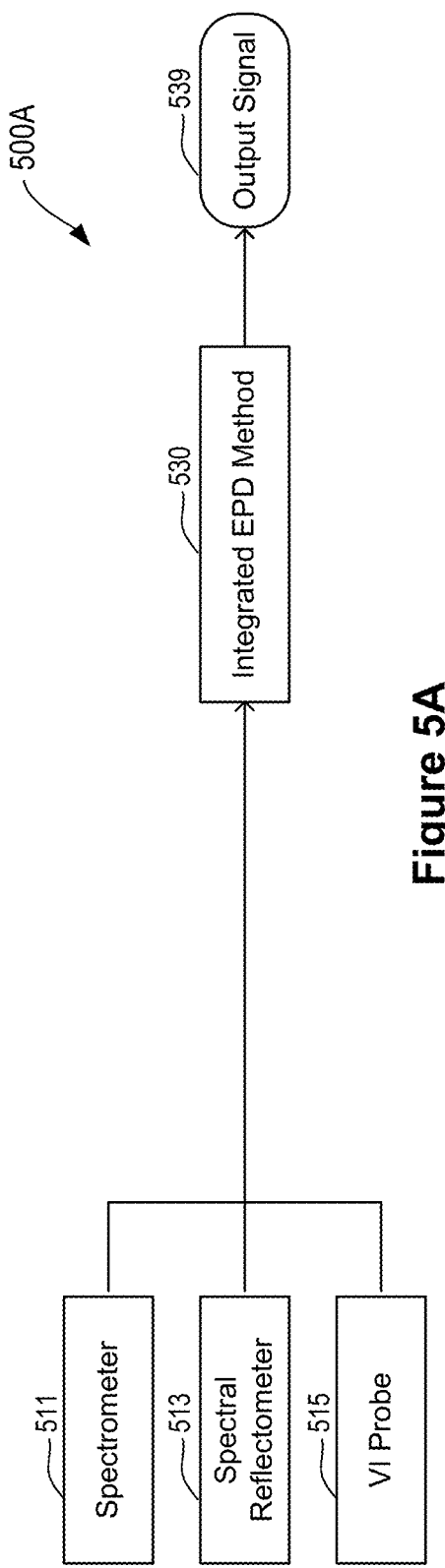
FIG. 5A shows a diagram of an EPD process, in accordance with one embodiment of the present disclosure.

FIG. 5A shows a diagram of a first EPD process 500A, in accordance with one example embodiment of the present disclosure. Herein, a spectrometer 511, a spectral reflectometer 513 and a VI probe 515 respectively correspond to the spectrometer 411, the spectral reflectometer 413 and the VI probe 415 in FIG. 4. An integrated estimation method such as an integrated EPD method 530 can be configured to estimate and output an output signal 539 using first data measured by the spectrometer 511, second data measured by the spectral reflectometer 513 and third data measured by the VI probe 515. The output signal 539 can include an integrated wafer state, such as a probability that a plasma-related process has reached an endpoint, an endpoint time of the plasma-related process or whether or not the plasma-related process has reached the endpoint.

When all the sensors (i.e. the spectrometer 511, the spectral reflectometer 513 and the VI probe 515) are operating normally, an overall amount of information will increase compared with related examples and therefore can be expected to improve the estimation accuracy. Nevertheless, when any of the three sensors fails, there is a risk that the estimated results will be affected.

Figure 5B:
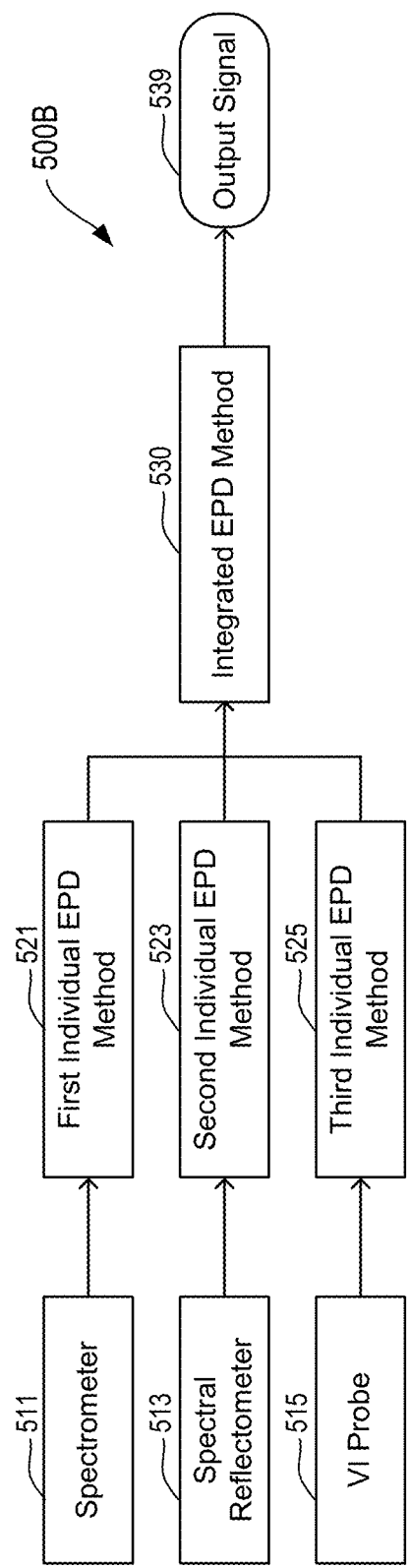
FIG. 5B shows another diagram of another EPD process, in accordance with another embodiment of the present disclosure.

FIG. 5B shows a diagram of a second EPD process 500B, in accordance with another example embodiment of the present disclosure. Herein, respective data measured by each sensor can be input into a respective individual EPD method to output a respective individual EPD estimate of the wafer, which results in a plurality of individual EPD estimates. The respective individual EPD method is configured to estimate the respective individual EPD estimate using the respective data. Then, the plurality of individual EPD estimates is input into the integrated EPD method 530 to output the output signal 539, such as an integrated EPD estimate.

Specifically, the first data measured by the spectrometer 511 are input into a first individual EPD method 521 to output a first individual EPD estimate. The second data measured by the spectral reflectometer 513 are input into a second individual EPD method 523 to output a second individual EPD estimate. The third data measured by the VI probe 515 are input into a third individual EPD method 525 to output a third individual EPD estimate. Accordingly, the integrated EPD method 530 is configured to estimate the integrated wafer state using the first, second and third individual EPD estimates.

In some embodiments, at least one individual EPD method (e.g. 521, 523 and/or 525) includes a classification model that is configured to output a probability that the respective individual EPD estimate is in a specified class. For example, the first individual EPD method 521 can include such a classification model and output a first probability of reaching the endpoint. Similarly, the second individual EPD method 523 can output a second probability of reaching the endpoint, and the third individual EPD method 525 can output a third probability of reaching the endpoint. The classification model can include logistic regression, linear discriminant analysis (LDA), naive Bayes, neural networks (e.g. RNN, LSTM, transformers), SVM, random forest, gradient boosting, Gaussian process and the like.

Then, the integrated EPD method 530 can estimate and output an integrated probability of reaching the endpoint using the first probability, the second probability and the third probability. FIG. 8A shows an example of the first probability, the second probability and the third probability as a function of time, shown by three dotted lines. In the example of FIG. 8B, the integrated EPD method 530 integrates the estimated values (i.e. the first probability, the second probability and the third probability) output by individual EPD methods (i.e. 521, 523 and 525), makes a final estimate and outputs a final result, i.e. the integrated probability represented by a solid black line. By passing through the individual EPD methods (i.e. 521, 523 and 525) in between, the final output/result can become robust against sensor malfunctions. The individual EPD methods (i.e. 521, 523 and 525) may perform EPD based on different algorithms.

FIG. 6A shows a diagram of an individual EPD process 600A, in accordance with one example embodiment of the present disclosure. FIGS. 7A-7F show data processing at various intermediate steps of the individual EPD process 600A, in accordance with some example embodiments of the present disclosure. The individual EPD process 600A can be used to implement the first individual EPD method 521, the second individual EPD method 523 and/or the third individual EPD method 525. The second individual EPD method 523 will be used herein for illustrative purposes.

Figure 7C:
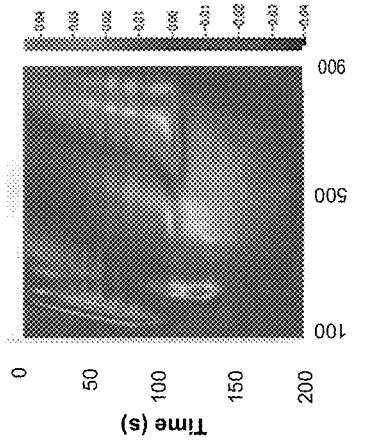
FIGS. 7A, 7B, 7C, 7D, 7E and 7F show data processing at various intermediate steps of an individual EPD process, in accordance with some example embodiments of the present disclosure.
Figure 7B:
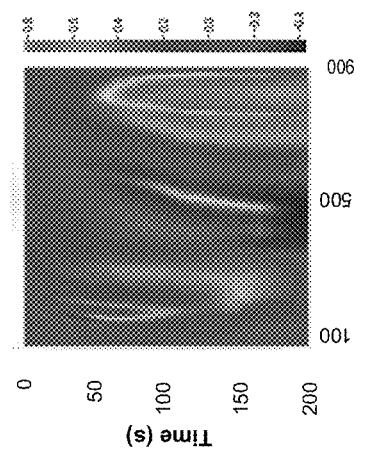
Figure 7A:
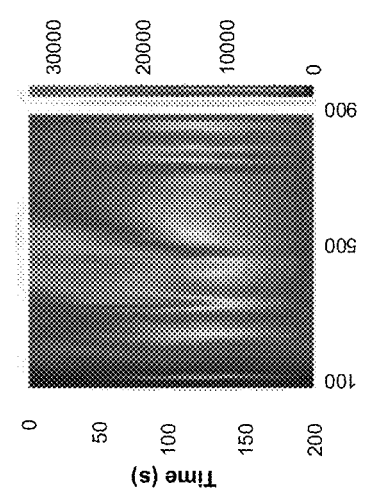

In Block 611, data acquisition is executed. In the example of FIG. 7A, the second data measured by the spectral reflectometer 513 are acquired. The second data herein include a first spectrum of a range of wavelengths at different times.

In Block 612, normalization is performed. In the example of FIG. 7B, the first spectrum is normalized using a previous spectrum (not shown) which was obtained N seconds ago, for example by dividing the first spectrum by the previous spectrum. As a result, a second spectrum is obtained and shown in FIG. 7B.

In Block 614, trend removal is performed. In the example of FIG. 7C, a third spectrum is obtained by taking the difference from another previous spectrum (not shown) which was obtained M seconds ago.

Figure 7F:
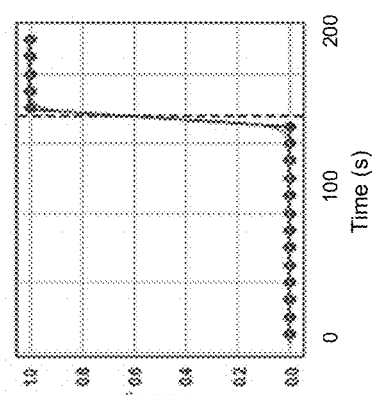
Figure 7E:
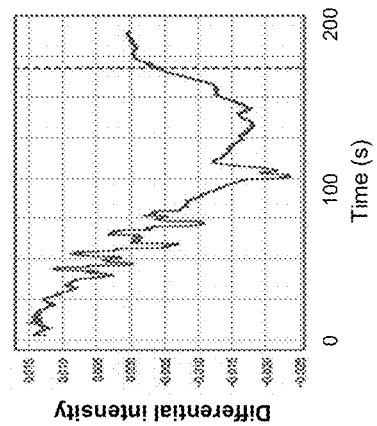
Figure 7D:
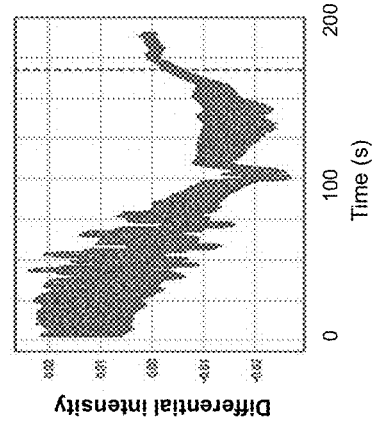

In Block 616, wavelength selection is performed. Particularly, a wavelength band that changes before and after detection of the endpoint can be selected. In the example of FIG. 7D, a wavelength band of 384.0 nm-387.5 nm is selected. Relative signal strengths for each wavelength (e.g. 384.0 nm, 384.5 nm, etc.) in the wavelength band are plotted versus time.

In Block 618, noise reduction is performed. In the example of FIG. 7E, signals are filtered to improve signal-to-noise ratio (SNR). As a result, the plot in FIG. 7E can be "cleaner" or "sharper" than the plots in FIG. 7D.

In Block 619, an endpoint is estimated. In the example of FIG. 7F, the second probability is obtained as a function of time. Thus, whether the endpoint has been reached can be estimated based on the signal waveform, i.e. the plot in FIG. 7F. Note that a rule-based algorithm and/or a supervised machine-learning-based algorithm can be applied.

FIG. 6B shows a diagram of another individual EPD process 600B, in accordance with another embodiment of the present disclosure. In a simpler form, data are pre-processed in Block 621 before used to estimate the endpoint in Block 629.

Figure 5C:
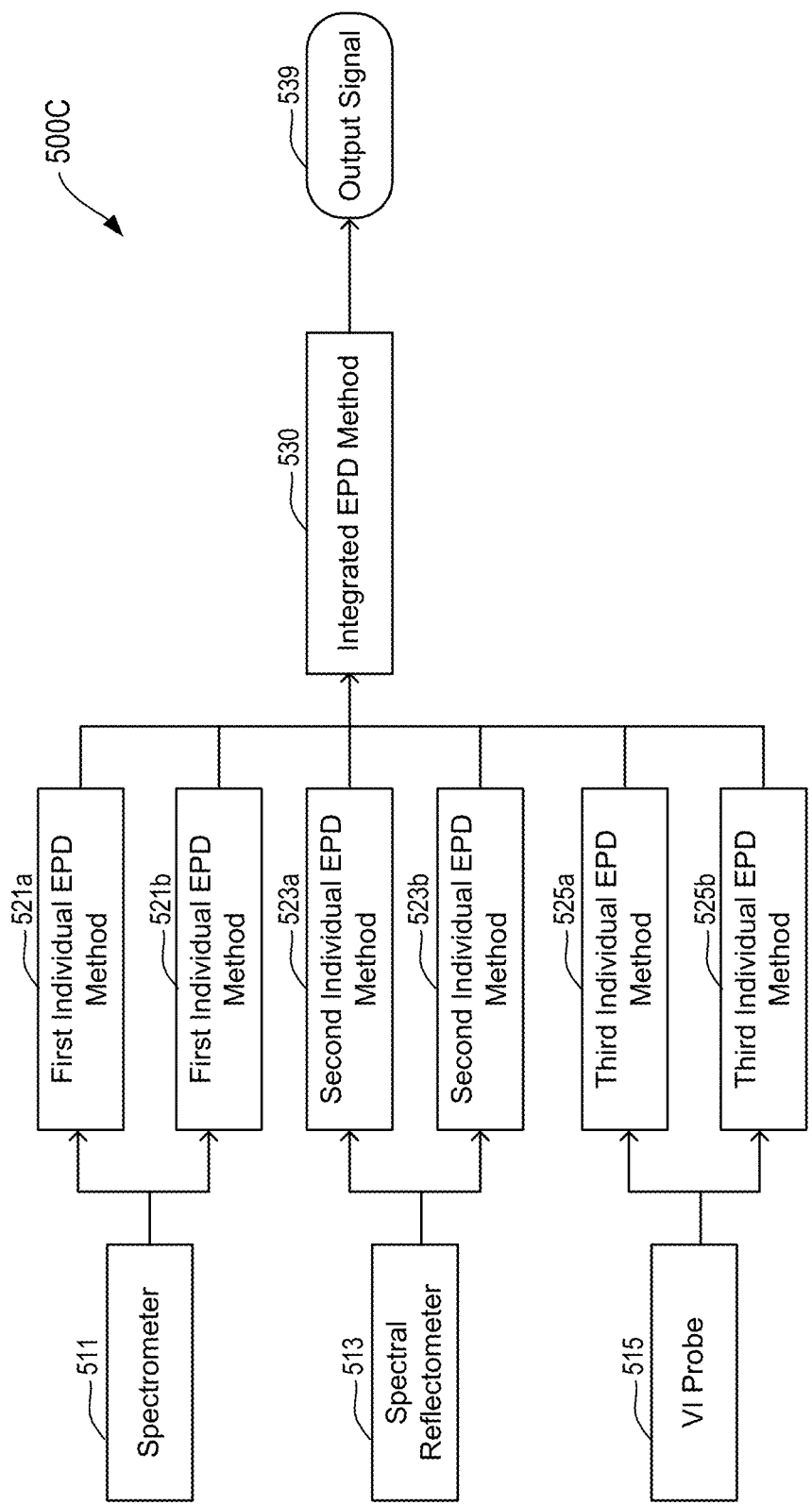
FIG. 5C shows yet another diagram of yet another EPD process, in accordance with yet another embodiment of the present disclosure.

FIG. 5C shows a diagram of a third EPD process 500C, in accordance with yet another example embodiment of the present disclosure. In the third EPD process 500C, respective data measured by each sensor are input into more than one respective individual EPD method to output more than one respective individual EPD estimate. In this example, the first data are input into two first individual EPD methods 521a and 521b. Consequently, two first individual EPD estimates, such as two first probabilities of reaching the endpoint, are output. The first individual EPD methods 521a and 521b both correspond to the first individual EPD method 521 and can use different wavelengths or different normalization methods for instance. Similarly, the second data are input into two second individual EPD methods 523a and 523b, and the third data are input into two third individual EPD methods 525a and 525b. As a result, six individually estimated EPD probabilities are obtained and input into the integrated EPD method 530. Unwanted trends can be removed with data generated with different delta-time. The final output will be more robust by arranging multiple individual EPD methods for each sensor. It should be understood that respective data measured by each sensor can be independently input into any number of respective individual EPD methods.

FIG. 5D shows a diagram of a fourth EPD process 500D, in accordance with yet another example embodiment of the present disclosure. In the fourth EPD process 500D, sensor data can be input into multiple individual EPD methods. In other words, an individual EPD method can receive data measured by multiple sensors as an input. In this example, the first data, the second data and the third data are each input into the three individual EPD methods (i.e. 521, 523 and 525). This configuration may improve EPD accuracy, but may be less robust against sensor faults. In other examples (not shown), not every individual EPD method needs to receive data measured by all three sensors as an input. Not every data needs to be input into all three individual EPD methods.

FIG. 5E shows a diagram of a fifth EPD process 500E, in accordance with yet another example embodiment of the present disclosure. In the fifth EPD process 500E, sensor data can be input into the integrated EPD method 530, in addition to the individual EPD estimates. In this example, the first data, the second data and the third data are input into the integrated EPD method 530. This configuration may improve EPD accuracy, but may be less robust against sensor faults. In other examples (not shown), not all sensor data need to be input into the integrated EPD method 530.

Figure 5F:
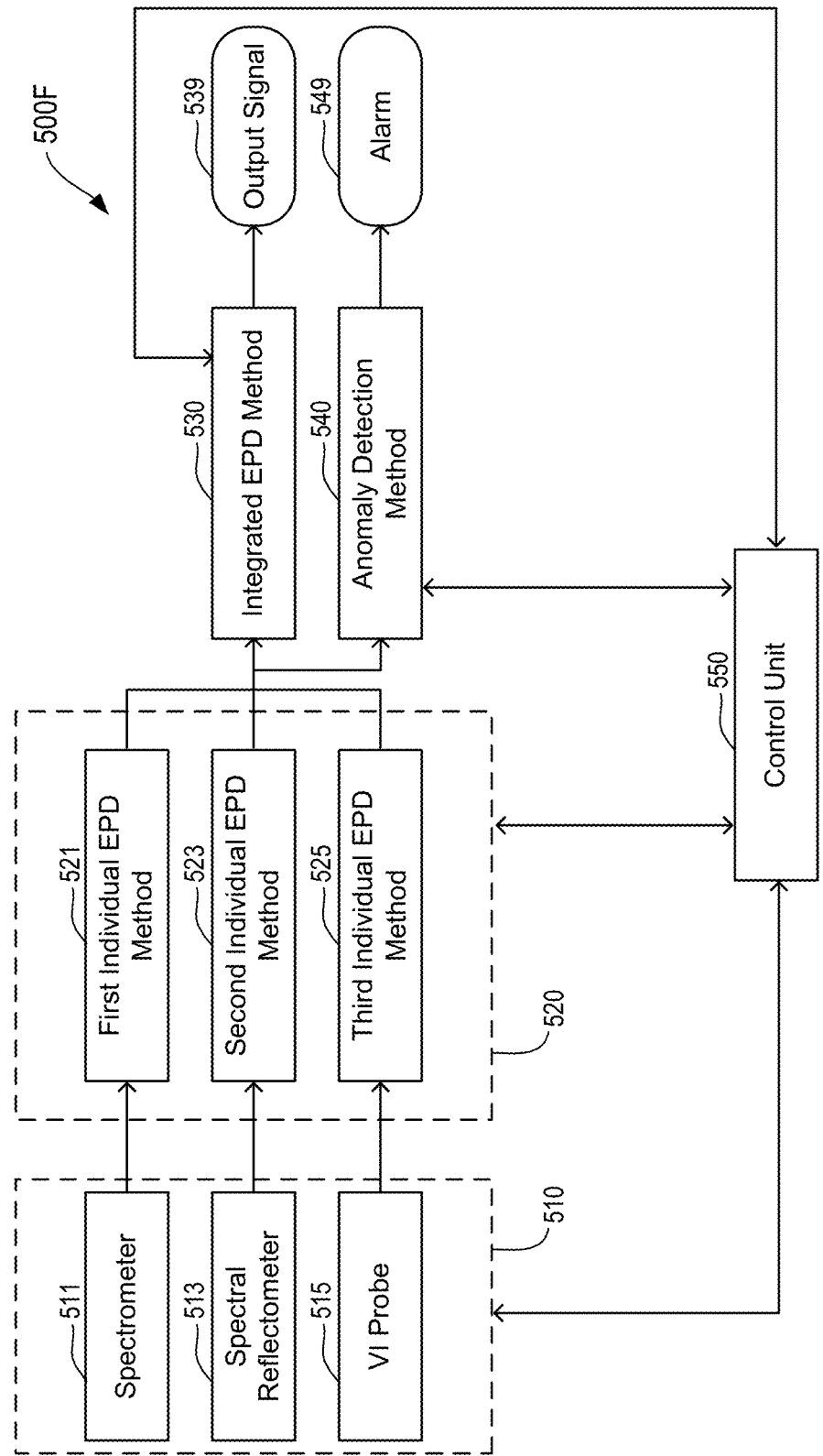
FIG. 5F shows yet another diagram of yet another EPD process, in accordance with yet another embodiment of the present disclosure.
Figure 9B:
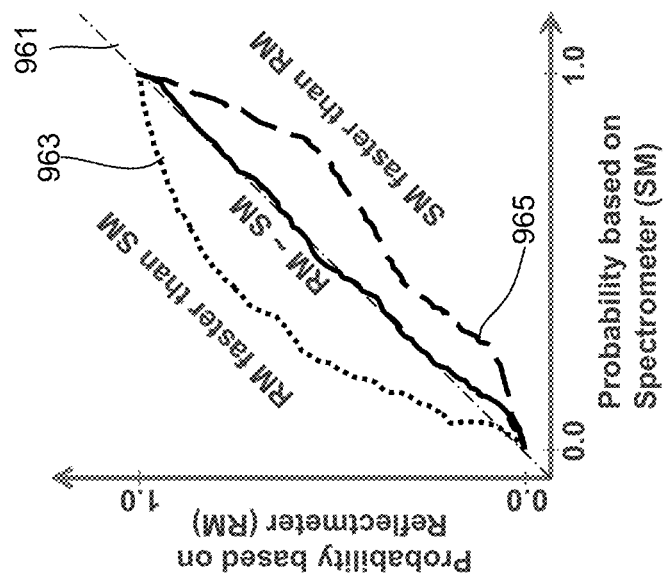
FIGS. 9A and 9B respectively show data processing before and after an anomaly detection process, in accordance with some example embodiments of the present disclosure.
Figure 9A:
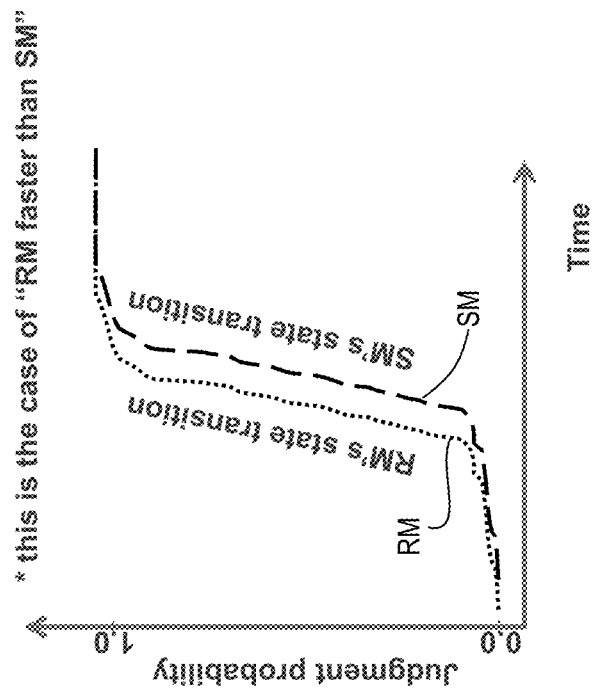

FIG. 5F shows a diagram of a sixth EPD process 500F, in accordance with yet another example embodiment of the present disclosure. The embodiment of the sixth EPD process 500F is similar to the embodiment of the second EPD process 500B and further includes an anomaly detection method 540. Herein, the individual EPD estimates are input into not only the integrated EPD method 530, but also the anomaly detection method 540. FIGS. 9A and 9B show an example of detecting an anomaly using the anomaly detection method 540.

In FIG. 9A, first time-series data measured by the spectrometer 511 are input into the first individual EPD method 521 to output a first series of first individual EPD estimates, noted as SM. Second time-series data measured by the spectral reflectometer 513 are input into the second individual EPD method 523 to output a second series of second individual EPD estimates, noted as RM.

In FIG. 9B, the two time series (i.e. the first series of first individual EPD estimates SM and the second series of second individual EPD estimates RM) are input into the anomaly detection method 540. In this example, the second time series RM is plotted versus the first time series SM, resulting in Line 963. That is, at a given time in FIG. 9A, a corresponding first EPD prediction and a corresponding second EPD prediction can be easily obtained from the first time series and the second time series respectively. The corresponding first EPD prediction and the corresponding second EPD prediction are respectively used as a corresponding abscissa and a corresponding ordinate for a corresponding point of Line 963 in FIG. 9B.

The anomaly detection method 540 can be configured to detect an anomaly by comparing transition slopes and transition timings of the two time series. As shown, Line 961 has a slope of 1 and an intercept of 0. Line 961 means identical transition slopes and identical transition timings. Line 965 is below Line 961. In the case of Line 965, the first time series SM indicates a faster transition than the second time series RM. Line 963 is above Line 961. In the case of Line 963, the first time series SM indicates a slower transition than the second time series RM, which can also be observed in FIG. 9A.

Figure 9D:
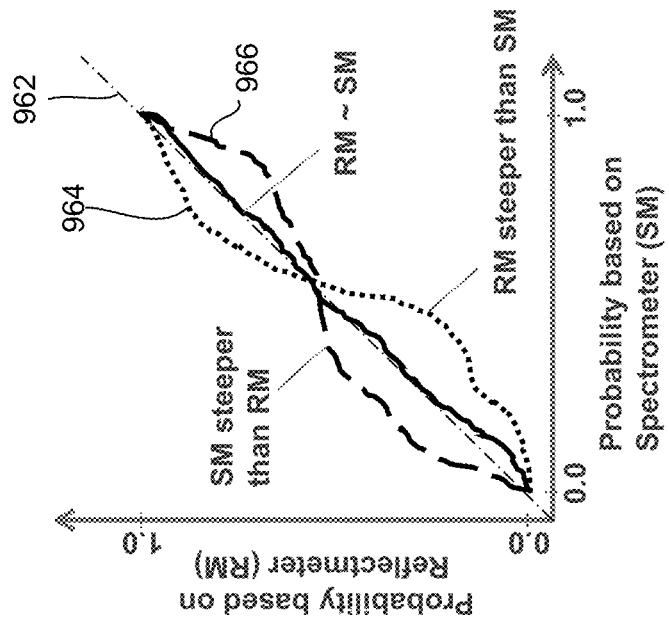
FIGS. 9C and 9D respectively show data processing before and after an anomaly detection process, in accordance with some example embodiments of the present disclosure.
Figure 9C:
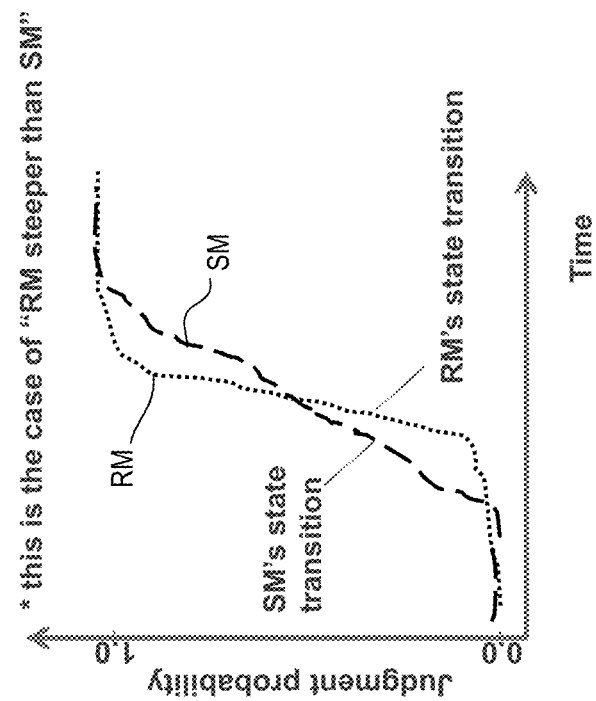

FIGS. 9C and 9D show another example of detecting an anomaly using the anomaly detection method 540. Herein, two time series, shown as RM and SM, are obtained similarly and input into the anomaly detection method 540 to generate Line 964. Transition slopes of the two time series are different from each other as illustrated in FIG. 9C, despite similar or identical transition timings. Therefore, an anomaly of sensor sensitivity between the spectrometer 511 and the spectral reflectometer 513 is detected. An alarm 549 may thus be generated in FIG. 5F. In FIG. 9D, Line 962 has a slope of 1 and an intercept of 0 and means identical transition slopes and identical transition timings. For Line 966, the first time series SM is steeper than (e.g. having larger slopes) the second time series RM. For Line 964, the second time series RM is steeper than (e.g. having larger slopes) the first time series SM, which can also be observed in FIG. 9C.

Generally speaking, an anomaly of sensor sensitivity is detected when a first difference between the two transition slopes exceeds a first threshold. An anomaly of process uniformity is detected when a second difference between the two transition timings exceeds a second threshold. No anomaly is detected when the first difference is within the first threshold and the second difference is within the second threshold. However, when the first difference exceeds the first threshold and the second difference exceeds the second threshold, one or more anomalies may occur, such as an anomaly of a sensor, an anomaly of an individual EPD method (e.g. algorithm) and/or an anomaly of the plasma-related process (e.g. a process rate). Further diagnostic actions may need to be taken in order to ascertain the one or more anomalies.

Referring back to FIG. 5F, the anomaly detection method 540 receives the individual EPD estimates as an input. In other embodiments (not shown), the anomaly detection method 540 may also receive the first data, the second data and/or the third data as an input, similar to FIG. 5E. Further, any combinations of the embodiments described herein and/or variations can also be implemented while still taking advantage of the techniques described herein.

Further, still referring to FIG. 5F, when an anomaly is detected for a sensor such as the VI probe 515, neither the third probability output by the third individual EPD method 525 nor the third data measured by the VI probe 515 will be input into the integrated EPD method 530. More generally speaking, when an anomaly is detected for one or more sensors of the plurality of sensors, one or more respective individual wafer states can be removed from the plurality of individual wafer states before the plurality of individual wafer states is input into the integrated estimation method. In other words, a sensor, which is detected to have a fault, does not contribute to the final integrated estimate, therefore improving estimate accuracy.

Further, a control unit 550 (also referred to as a controller 550) may optionally be included in the example of FIG. 5F. Components of a corresponding plasma tool can be connected to and controlled by the control unit 550 that may optionally be connected to a corresponding memory storage unit and user interface (all not shown). Various plasma-processing operations can be executed via the user interface, and various plasma processing recipes and operations can be stored in a storage unit. Accordingly, a given substrate can be processed within a plasma chamber with various microfabrication techniques.

It will be recognized that the control unit 550 may be coupled to various components of the corresponding plasma tool to receive inputs from and provide outputs to the components. For example, the control unit 550 can be configured to receive data from sensors 510 together or individually. That is, the control unit 550 can be configured to receive the first data from the spectrometer 511, the second data from the spectral reflectometer 513 and/or the third data from the VI probe 515. The control unit 550 can also be configured to adjust knobs and control settings for the sensors 510 (e.g. 511, 513 and 515) together or individually. Of course the adjustments can be manually made as well. It will also be recognized that the control unit 550 may be coupled to various components of the sixth EPD process 500F to receive inputs from and provide outputs to the components. For example, the control unit 550 can be configured to receive individual EPD estimates, an integrated EPD estimate and/or an anomaly detection estimate from individual EPD methods 520 (e.g. 521, 523 and 525), the integrated EPD method 530 and/or the anomaly detection method 540 respectively. The control unit 550 can further be configured to implement the individual EPD methods 520 (e.g. 521, 523 and 525), the integrated EPD method 530 and/or the anomaly detection method 540. Further, the control unit 550 may receive inputs from and provide outputs to the individual EPD methods 520 (e.g. 521, 523 and 525) together or individually. Additionally, when an anomaly of a given sensor and/or a given individual EPD method is detected by the anomaly detection method 540, the control unit 550 may adjust the given sensor, and/or exclude respective data and/or a respective individual EPD estimate from the integrated EPD method 530, which of course can also be manually accomplished as well. While not shown, a control unit which corresponds to the control unit 550 can also be included in FIGS. 5A-5E in some embodiments.

The control unit 550 can be implemented in a wide variety of manners. In one example, the control unit 550 is a computer. In another example, the control unit 550 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Note that the embodiments described herein focus on a probability of reaching the endpoint as a wafer state estimated by the individual EPD methods and the integrated EPD method. In some embodiments, the wafer state includes a critical dimension (CD). CD can include, but is not limited to, one or more feature dimensions such as width, length, sidewall angle, feature depth, and/or other feature dimensions. For example, with respect to a gate of a transistor device, CD can include top, middle and/or bottom widths of the gate as well as the gate-related width at a height level for other structures associated with the transistor device. Further, CD can include CD profiles which may include one-dimension (1D) features, two-dimensional (2D) features, three-dimensional (3D) features, or any combination thereof.

Additionally, other wafer states can also be used. In some embodiments, an etch rate, etch selectivity, a film deposition rate or other parameters can be used. The etch rate, for example, can be a film removal rate in a selected direction, such as a vertical direction. The etch selectivity, for example, can be a ratio of etch rates for two types of films. The film deposition rate, for example, can be an increase in film thickness per unit time at a selected area of a wafer, such as a center of the wafer. Additionally, the wafer state may include a deposition rate, a film thickness, a film chemical composition, a film reflectivity, a film absorbance, an amount of remaining mask material, film resistivity and/or film conductivity.

In some embodiments, the wafer state is continuous. That is, the wafer state is a numeric state that has an infinite number of values between any two values. For example, the wafer state can include a film thickness, a probability, etc. An integrated estimation method can be configured to estimate such an integrated wafer state by averaging a plurality of individual wafer states. For example, an integrated film thickness can be obtained by averaging a plurality of individual thicknesses. An integrated spectrum can be obtained by taking a median image of a plurality of individual spectra. Additionally, an individual estimation method can include a regression model that is configured to estimate and output a corresponding individual wafer state. The regression model can include linear regression, principal component regression, partial least squares regression (PLS), state space model (e.g. Kalman Filter, ARMA), neural networks (e.g. RNN, LSTM, transformers), SVM, random forest, gradient boosting, Gaussian process and the like.

In some embodiments, the wafer state is non-continuous, e.g. discrete or categorical. Specifically, the wafer state is discrete when the wafer state is a numeric state that has a countable number of values between any two values. The wafer state is categorical when the wafer state includes a finite number of categories or distinct groups. For example, a categorical wafer state can include whether or not an endpoint has been reached. Accordingly, an integrated estimation method can be configured to estimate an integrated wafer state by outputting a representative individual wafer state that is identical to at least half of the plurality of individual wafer states. Consider FIG. 5B for example. When the three individual EPD methods (i.e. 521, 523 and 525) are configured to output whether or not the endpoint has been reached, the approach of "taking a majority vote" can be taken. That is, if at least two of the three individual EPD methods output that the endpoint has been reached, the integrated estimation method will output that the endpoint has been reached. If at least two of the three individual EPD methods output that the endpoint has not been reached, the integrated estimation method will output that the endpoint has not been reached.

Note that the individual estimation methods (e.g. 521, 523 and 525) and/or the integrated estimation method (e.g. 530)

can include a general regression or classification algorithm. Such a regression algorithm can include linear regression, principal component regression, partial least squares regression (PLS), state space model (e.g. Kalman Filter, ARMA) and the like. Such a classification algorithm can include logistic regression, linear discriminant analysis (LDA), naive Bayes and the like. Further, neural networks (e.g. RNN, LSTM, transformers), SVM, random forest, gradient boosting and Gaussian process can be used for both regression and classification.

Further, supervised learning can be applied to machine learning for the individual estimation methods (e.g. 521, 523 and 525) and/or the integrated estimation method (e.g. 530). Explanation variables can be defined for each of time trace window. If the endpoint is not included in the window, the label is set to 0. If it is included, the end point is assumed to be reached and the label is set to 1. Additionally, training data size can be increased by scaling the amplitude and time of the time series data or adding offsets and random noise, which enables the so-called data augmentation and building a more robust estimation model with a relatively small data set.

It should be further noted that a number of methods can be used to monitor each sensor for fault detection. FIG. 9A shows a method to monitor time at which an estimated value exceeds a specified threshold value. FIG. 9C shows another method of monitoring transition times of estimated values between lower and upper limits using more than one sensor. Another method, as shown in FIGS. 9B and 9D, includes monitoring a correlation coefficient and a coefficient of determination between estimated values output by individual estimation methods.

Note that the plasma tool in the present disclosure may be a capacitively-coupled plasma processing apparatus, inductively-coupled plasma processing apparatus, microwave plasma processing apparatus, Radial Line Slot Antenna (RLSA™) microwave plasma processing apparatus, electron cyclotron resonance (ECR) plasma processing apparatus, or other types of processing systems or combination of systems. Thus, it will be recognized by those skilled in the art that the techniques described herein may be utilized with any of a wide variety of plasma processing systems. The plasma tool can be used for a wide variety of operations including, but not limited to, etching, deposition, cleaning, plasma polymerization, plasma-enhanced chemical vapor deposition (PECVD), atomic layer deposition (ALD), atomic layer etch (ALE), and the like. The structure of a plasma tool is well known to one skilled in the art. It will be recognized that different and/or additional plasma process systems may be implemented while still taking advantage of the techniques described herein.

The various embodiments described herein offer several advantages. For example, even when one or more sensors fail, the wafer state can be estimated based on the output of other normal sensors. By integrating the individual estimation results (e.g. taking a majority vote, taking an average value or taking a median image), the impact of failures on the estimated results (e.g. the integrated wafer state) can be suppressed. Sensor failures can be detected, for example in the case of a sensor with a wrong wafer state estimate or a sensor with shifted estimate. Variations in a process rate (i.e. an etch rate, a deposition rate, etc.) across the wafer surface can be evaluated from the deviation of individual estimation results (for example processing at the edge of the wafer may be slow, etc.).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for monitoring a plasma-related process in a plasma tool, the method comprising:

executing the plasma-related process on a wafer within a plasma processing chamber;

measuring at least one of a physical, electrical or chemical property associated with the plasma-related process at each of a plurality of sensors coupled to the plasma processing chamber during the executing the plasma-related process on the wafer, wherein the plurality of sensors comprises a spectrometer, a spectral reflectometer and a voltage and current (VI) probe;

inputting respective data measured by each sensor of the plurality of sensors into a respective individual estimation method to determine a respective individual wafer state of the wafer, resulting in a plurality of individual wafer states, wherein each individual wafer state is an estimation of the same actual wafer state of the wafer and the respective individual estimation method estimates the respective individual wafer state using at least the respective data, first data measured by the spectrometer are input into a first individual EPD method to output a first individual endpoint detection (EPD) estimate, second data measured by the spectral reflectometer are input into a second individual EPD method to output a second individual EPD estimate, and third data measured by the VI probe are input into a third individual EPD method to output a third individual EPD estimate;

inputting the plurality of individual wafer states into an integrated estimation method which uses a combination of the plurality of individual wafer states to determine an integrated wafer state of the wafer, wherein the integrated wafer state is an estimation of the actual wafer state based on at least the plurality of individual wafer states, and the first individual EPD estimate, the second individual EPD estimate and the third individual EPD estimate are input into an integrated EPD estimation method to determine an integrated EPD estimate;

determining an endpoint of the plasma-related process based on the integrated EPD estimate; and ending the plasma-related process at the endpoint of the plasma-related process.

2. The method of claim 1, further comprising:
inputting the plurality of individual wafer states into an anomaly detection method that is configured to detect an anomaly using at least the plurality of individual wafer states.

3. The method of claim 2, further comprising:
inputting respective time-series data measured by at least two sensors of the plurality of sensors into at least two respective individual estimation methods to output at least two time series of individual wafer states; and
inputting the at least two time series of individual wafer states into the anomaly detection method.

4. The method of claim 3, further comprising:
comparing respective transition slopes and respective transition timings of the at least two time series of individual wafer states.

5. The method of claim 4, wherein:
an anomaly of sensor sensitivity is detected when a first difference between the respective transition slopes exceeds a first threshold,
an anomaly of process uniformity is detected when a second difference between the respective transition timings exceeds a second threshold,
at least one anomaly of a sensor, a respective individual estimation method or the plasma-related process is detected when the first difference exceeds the first threshold and the second difference exceeds the second threshold, and
no anomaly is detected when the first difference is within the first threshold and the second difference is within the second threshold.

6. The method of claim 3, further comprising:
plotting one of the at least two time series versus another one of the at least two time series.

7. The method of claim 2, further comprising:
when an anomaly is detected for one or more sensors of the plurality of sensors, removing one or more respective individual wafer states from the plurality of individual wafer states before inputting the plurality of individual wafer states into the integrated estimation method.

8. The method of claim 1, further comprising:
inputting, in addition to the plurality of individual wafer states, respective data measured by at least one sensor of the plurality of sensors into the integrated estimation method to output the integrated wafer state.

9. The method of claim 1, further comprising:
inputting, in addition to first data measured by a first sensor of the plurality of sensors, respective data measured by one or more other sensors of the plurality of sensors into a first individual estimation method to output a first individual wafer state.

10. The method of claim 1, wherein first data measured by a first sensor of the plurality of sensors are input into a first individual estimation method to output a first individual wafer state, the method further comprising:
inputting the first data into at least another first individual estimation method to output at least another first individual wafer state.

11. The method of claim 1, wherein:
the integrated estimation method is configured to estimate the integrated wafer state by averaging the plurality of individual wafer states, when the plurality of individual wafer states each is continuous.

12. The method of claim 1, wherein:
the integrated estimation method is configured to estimate the integrated wafer state by outputting a representative individual wafer state that is identical to at least half of the plurality of individual wafer states, when the plurality of individual wafer states each is discrete or categorical.

13. The method of claim 1, wherein:
at least one individual estimation method comprises a regression model that is configured to estimate and output a respective individual wafer state that is continuous.

14. The method of claim 1, wherein:
at least one individual estimation method comprises a classification model that is configured to output a probability that the respective individual wafer state is in a specified class.

15. The method of claim 1, wherein:
the integrated wafer state comprises at least one of a critical dimension (CD), an etch rate, etch selectivity, an amount of remaining mask material, a deposition rate, a film thickness, a film chemical composition, a film reflectivity, film absorbance, film resistivity or film conductivity.

16. The method of claim 1, wherein:
at least one individual estimation method is configured to output an endpoint time, output a probability that the plasma-related process has reached an endpoint or output whether or not the plasma-related process has reached an endpoint.

17. The method of claim 1, wherein:
the plurality of sensors further comprises at least one of a scatterometer, a reflectometer, an optical emission spectrometry (OES) sensor, a plasma sensor, a mass spectrometer or a radio frequency (RF) sensor.

18. The method of claim 1, wherein:
the actual wafer state of the wafer is an endpoint of the plasma-related process.

19. The method of claim 1, wherein:
the plasma-related process includes at least one of etching, deposition, cleaning, plasma polymerization, plasma-enhanced chemical vapor deposition, atomic layer deposition or atomic layer etch.

20. An apparatus, comprising:
a controller including a processor that is programmed to:
execute a plasma-related process on a wafer within a plasma processing chamber;
measure at least one of a physical, electrical or chemical property associated with the plasma-related process at each of a plurality of sensors coupled to the plasma processing chamber during the executing the plasma-related process on the wafer, wherein the plurality of sensors comprises a spectrometer, a spectral reflectometer and a VI probe;
input respective data measured by each sensor of the plurality of sensors into a respective individual estimation method to determine a respective individual wafer state of the wafer, resulting in a plurality of individual wafer states, wherein each individual wafer state is an estimation of the same actual wafer state of the wafer and the respective individual estimation method estimates the respective individual wafer state using at least the respective data, first data measured by the spectrometer are input into a first individual EPD method to output a first individual endpoint detection (EPD) estimate, second data measured by the spectral reflectometer are input into a second individual EPD method to output a second individual EPD estimate, and third data measured by the VI probe are input into a third individual EPD method to output a third individual EPD estimate;
input the plurality of individual wafer states into an integrated estimation method which uses a combination of the plurality of individual wafer states to determine an integrated wafer state of the wafer, wherein the integrated wafer state is an estimation of the actual wafer state based on at least at least the plurality of individual wafer states, and the first individual EPD estimate, the second individual EPD estimate and the third individual EPD estimate are input into an integrated EPD estimation method to determine an integrated EPD estimate;
determine an endpoint of the plasma-related process based on the integrated EPD estimate; and
end the plasma-related process at the endpoint of the plasma-related process.

21. A method for monitoring a plasma-related process in a plasma tool, the method comprising:
executing the plasma-related process on a wafer within a plasma processing chamber;
measuring at least one of a physical, electrical or chemical property associated with the plasma-related process at each of a plurality of sensors coupled to the plasma processing chamber during the executing the plasma-related process on the wafer, wherein the plurality of sensors comprises a spectrometer, a spectral reflectometer and a voltage and current (VI) probe;
inputting respective data measured by each sensor of the plurality of sensors into a respective individual estimation method to determine a respective individual wafer state of the wafer, resulting in a plurality of individual wafer states, wherein each individual wafer state is an estimation of the same actual wafer state of the wafer and the respective individual estimation method estimates the respective individual wafer state using at least the respective data, first data measured by the spectrometer are input into a first individual EPD method to output a first individual endpoint detection (EPD) estimate, second data measured by the spectral reflectometer are input into a second individual EPD method to output a second individual EPD estimate, and third data measured by the VI probe are input into a third individual EPD method to output a third individual EPD estimate;
inputting the plurality of individual wafer states into an integrated estimation method which uses a combination of the plurality of individual wafer states to determine an integrated wafer state of the wafer, wherein the integrated wafer state is an estimation of the actual wafer state based on at least the plurality of individual wafer states, and the first individual EPD estimate, the second individual EPD estimate and the third individual EPD estimate are input into an integrated EPD estimation method to determine an integrated EPD estimate;
inputting the plurality of individual wafer states into an anomaly detection method that is configured to detect an anomaly using at least the plurality of individual wafer states;
determining an anomaly of a sensor of the plurality of sensors by the anomaly detection method; and
adjusting the sensor.

* * * * *